US012672524B2

(12) United States Patent
Bhosle et al.

(10) Patent No.: US 12,672,524 B2
(45) Date of Patent: Jun. 30, 2026

(54) HARD MASK STRESS MODULATION USING LOW ENERGY IMPLANT

(71) Applicant: Applied Materials, Inc., Santa Clara, CA (US)

(72) Inventors: Vikram M. Bhosle, North Reading, MA (US); Deven Raj Mittal, Middleton, MA (US); Manohar Harsha Karigerasi, Sunnyvale, CA (US); Sarah Michelle Bobek, Santa Clara, CA (US); Abdul Aziz Khaja, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 259 days.

(21) Appl. No.: 18/733,506

(22) Filed: Jun. 4, 2024

(65) Prior Publication Data

US 2025/0372379 A1 Dec. 4, 2025

(51) Int. Cl.
| | |
|---|---|
| *H10P 76/40* | (2026.01) |
| *H10P 30/20* | (2026.01) |
| *H10P 50/00* | (2026.01) |
| *H10P 76/20* | (2026.01) |

(52) U.S. Cl.
CPC ........ *H10P 76/4085* (2026.01); *H10P 30/204* (2026.01); *H10P 30/21* (2026.01); *H10P 50/71* (2026.01); *H10P 76/20* (2026.01)

(58) Field of Classification Search
None
See application file for complete search history.

(56) References Cited

U.S. PATENT DOCUMENTS

| | | | |
|---|---|---|---|
| 9,117,766 B2 | 8/2015 | Sant | |
| 11,469,107 B2 | 10/2022 | Prasad | |
| 12,374,549 B2* | 7/2025 | Shao | H10P 30/40 |
| 2017/0040221 A1* | 2/2017 | Kim | H10D 84/0158 |
| 2022/0406594 A1 | 12/2022 | Aydin | |

* cited by examiner

*Primary Examiner* — Roberts P Culbert
(74) *Attorney, Agent, or Firm* — KDW Firm PLLC

(57) ABSTRACT

Provided herein are devices and techniques for using a low-energy implant for hard mask stress modulation. In one approach, a method may include providing a stack of mandrel film layers, implanting an upper layer of the stack of mandrel film layers, and forming a mask film layer over the upper layer. The method may further include forming a patterning layer over the mask film layer, partially removing the patterning layer and the mask film layer, and patterning the stack of mandrel film layers to form a set of vertical features.

20 Claims, 5 Drawing Sheets

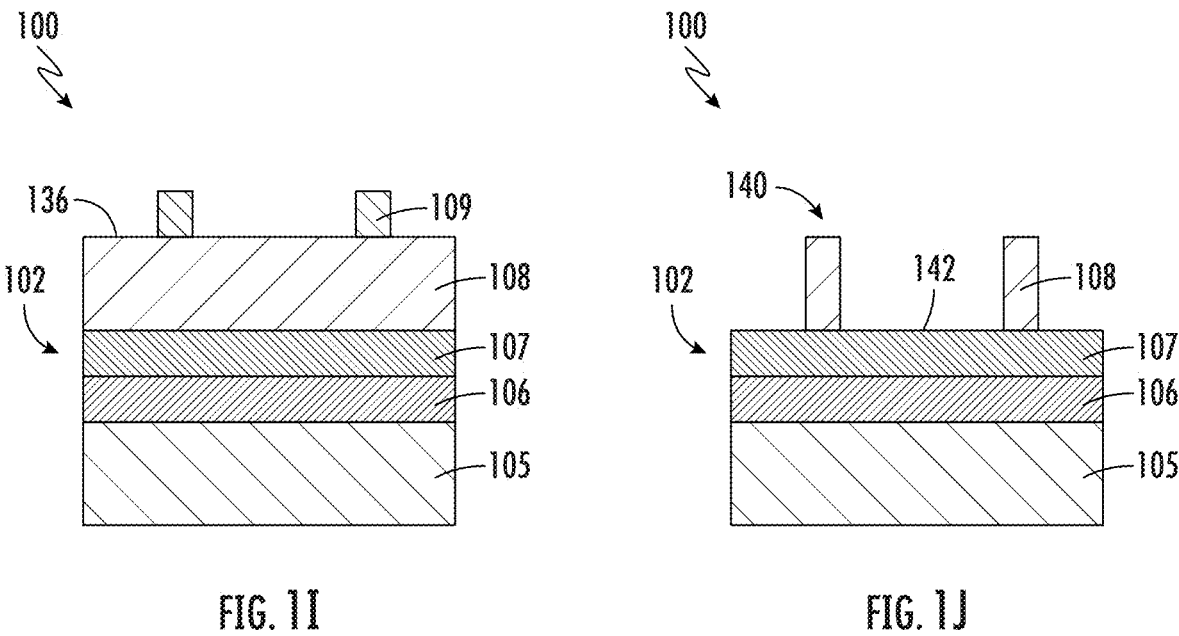
FIG. 1I                    FIG. 1J

HARD MASK STRESS MODULATION USING LOW ENERGY IMPLANT

FIELD OF THE DISCLOSURE

The present disclosure relates to semiconductor device patterning and, more particularly, to devices and techniques for using a low-energy implant for hard mask stress modulation.

BACKGROUND OF THE DISCLOSURE

The evolution of chip designs continually requires faster circuitry and greater circuit density. The demands for greater circuit density necessitate a reduction in the dimensions of the integrated circuit components. As the dimensions of the integrated circuit components are reduced (e.g., to sub-micron dimensions), more elements are required to be put into a given area on a semiconductor integrated circuit. However, conventional lithography-based patterning processes are challenging in the face of such pattern miniaturization. Approaches to miniaturization include spacer patterning such as self-aligned double patterning (SADP) and self-aligned quadruple patterning (SAQP).

In SAQP, mandrels are patterned on an underlying layer. One or more film layers are then deposited on the exposed surfaces of the mandrels and the underlying layer. Horizontal surfaces of the film and the mandrels are then etched to form spacers. Such an approach allows for the formation of narrow gates at a quarter of the original pitch. However, SAQP and other patterning approaches suffer from high line edge roughness (LER) and high line width roughness (LWR), which describe the amount of variation on the edges and widths of the resist features. Moreover, LER and LWR become more significant as feature sizes become smaller, thereby limiting the effective resolution of the semiconductor features. Accordingly, as lithography techniques push components to smaller dimensions, achieving acceptable LER and LWR becomes increasingly challenging.

One current approach to address LWR is to use an advanced mandrel film having higher density. However, high density films may have high stress, which causes issues such as wafer bowing, misalignment during pattern transfer, overlay shifts, and more.

Accordingly, improved approaches are needed for SAQP including a low stress mandrel film hard mask.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing a stack of mandrel film layers, implanting an upper layer of the stack of mandrel film layers, and forming a mask film layer over the upper layer. The method may further include forming a patterning layer over the mask film layer, partially removing the patterning layer and the mask film layer, and patterning the stack of mandrel film layers to form a set of vertical features.

In another aspect, a method for patterning a stack of mandrel film layers may include implanting an upper layer of the stack of mandrel film layers, wherein the implant is performed at an implant energy less than 10 kV, and forming a mask film layer over the upper layer. The method may include forming a patterning layer over the mask film layer, partially removing the patterning layer and the mask film layer, and patterning the stack of mandrel film layers to form a set of vertical features.

In yet another aspect, a method for patterning a stack of dynamic random-access memory (DRAM) mandrel film layers may include implanting an upper layer of the stack of mandrel film layers, wherein the implant is performed at an implant energy less than 10 kV, and forming a mask film layer over the upper layer. The method may further include forming a patterning layer over the mask film layer, partially removing the patterning layer and the mask film layer, and patterning the stack of mandrel film layers to form a set of vertical features.

BRIEF DESCRIPTION OF THE DRAWINGS

The accompanying drawings illustrate exemplary approaches of the disclosure, including the practical application of the principles thereof, as follows:

FIGS. 1I-1J illustrate side cross-sectional views of the mask following one or more removal processes to form a set of vertical structures, according to embodiments of the present disclosure;

Figures 1A, 1B, 1C, 1D:
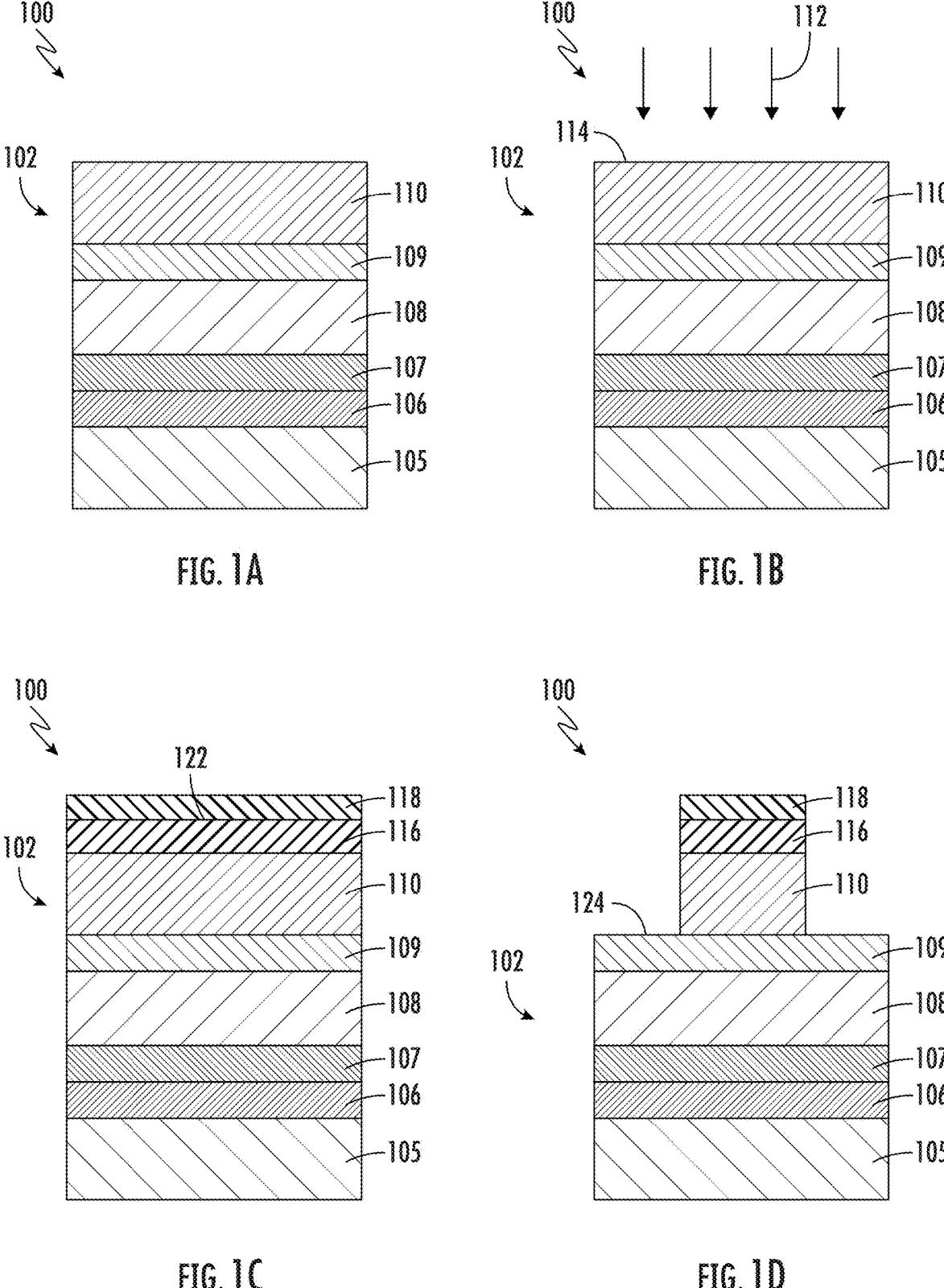
FIG. 1A illustrates a side cross-sectional view of a stack of film layers of a mask, according to embodiments of the present disclosure.
FIG. 1B illustrates a side cross-sectional view of the mask during an implant process, according to embodiments of the present disclosure.
FIG. 1C illustrates a side cross-sectional view of a high stress layer and a masking layer formed over the stack of film layers, according to embodiments of the present disclosure.
FIG. 1D illustrates a side cross-sectional view of the mask following removal of a portion of the high stress layer and masking layer, according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, systems, and devices in accordance with the present disclosure will now be described more fully hereinafter with reference to the accompanying drawings, where various embodiments are shown. The methods, systems, and devices may be embodied in many different forms and are not to be construed as being limited to the embodiments set forth herein. Instead, these embodiments are provided so the disclosure will be thorough and complete, and will fully convey the scope of the methods to those skilled in the art.

Self-aligned double patterning (SADP) and self-aligned quadruple patterning (SAQP) benefit from high density film with low stress. Deposited films having a lower stress often yield lower density and, consequently, lead to poor LWR. Higher density films tend to have better LWR performance, and are also desirable for improved etch selectivity, which enables thinner films for future nodes.

Embodiments described herein are directed to low energy (e.g., <10 kV) implant treatments for advanced mandrel and hard mask (HM) films, such as films having a thickness of approximately 500-600 A, to enable films with high density and low stress. In some embodiments, a room temperature (RT) or higher temperature (e.g., approximately 350-500° C.) implant may be used to lower film stress and improve sensitivity of a subsequent thermal treatment.

With reference to FIG. 1A, an approach for forming a hard mask (hereinafter "mask") 100 will be described. The mask 100 may be a logic/dynamic random-access memory (DRAM) hard mask, which is formed over a substrate or over other device layers (not shown). In some embodiments, the mask 100 may include a plurality of stacked, advanced mandrel film layers 102. One or more of the mandrel film layers 102 may have a high density, e.g., a density greater than 1.6 g/cc. Although not limited to any particular layering material, arrangement, and/or thickness, the mandrel film layers 102 may include a first carbon layer 105, a first dielectric antireflective coating (DARC) layer 106 atop the first carbon layer 105, a first oxide layer (SiO2) 107 formed atop the first DARC layer 106, an ashable hard mask (AHM) 108 formed atop the first oxide layer 107, a second DARC layer 109 formed atop the AHM 108, and a second carbon layer (e.g., spin-on-carbon) 110 formed atop the second DARC layer 109.

As shown in FIG. 1B, the mask 100 may be subject to an implant process 112. More specifically, the implant process 112 may include delivering ions into an upper surface 114 of the second carbon layer 110 using a low energy (e.g., <10 KV) process. In various embodiments, the implant process 112 may be performed by a beam line or other plasma implantation tool that directs ions from an ion source in a predefined direction. The implant energy may remain substantially constant during the implant process 112. The implant energy utilized to energize the dopant ions will be determined by the type of dopant, the type of material being impacted by the dopant, and the depth of implantation targeted.

In some embodiments, the implant process 112 may be performed while a platen or pedestal (not shown) upon which the mask is retained is held at room temperature, e.g., between 15-25° C. In other embodiments, the implant process 112 may be performed while the platen or pedestal high temperature, e.g., between 300-550° C. In both cases, the ions of the implant process 112 may include helium (He), hydrogen (H2), or methane (CH4), which may be diluted with H2 or He gas. Furthermore, in some embodiments, a direct-current (DC) bias may be applied to the platen or pedestal during the implant process 112.

As shown in FIG. 1C, a mask film layer 116 may then be formed over the second carbon layer 110, following the implant process 112. As shown, the mask film layer 116 may be a high stress film layer formed directly atop the upper surface 114 of the second carbon layer 110. In some embodiments, the mask film layer 116 may be a spin on dielectric (SOD). A patterning or masking layer 118 may then be formed over the mask film layer 116. In some embodiments, the masking layer 118 may be a photoresist formed directly atop an upper surface 122 of the mask film layer 116.

Patterning of the mask 100 may then continue, as shown in FIG. 1D, wherein a portion of the mask film layer 116 and the masking layer 118 may be removed. In some embodiments, the mask film layer 116 and the masking layer 118 are removed selective to an upper surface 124 of the second DARC layer 109. The masking layer 118 and the mask film layer 116 may then be removed from over the second carbon layer 110 to form a mandrel 123, as shown in FIG. 1E.

Figures 1E, 1F, 1G, 1H:
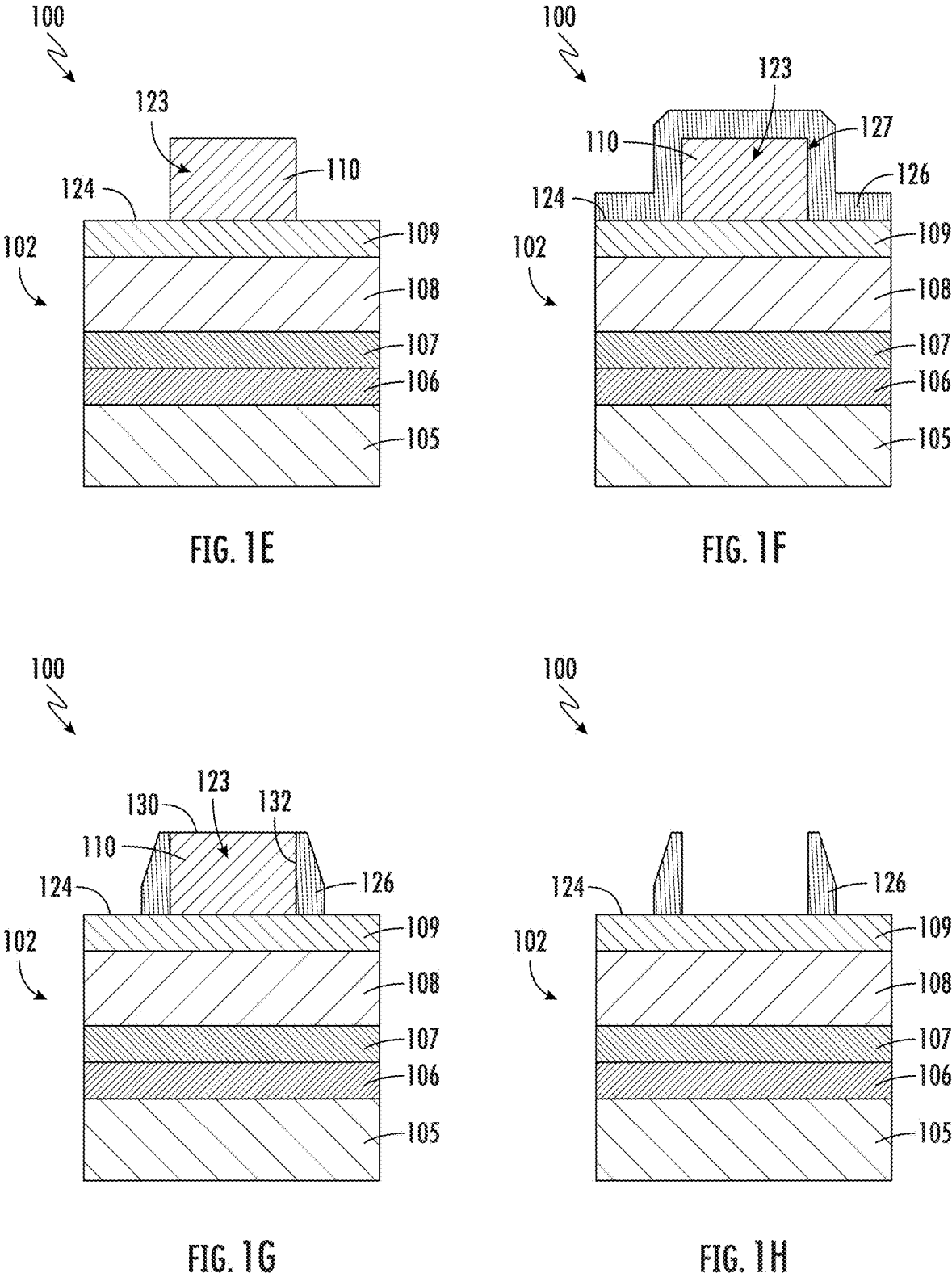
FIG. 1E illustrates a side cross-sectional view of the mask following formation of a mandrel, according to embodiments of the present disclosure.
FIG. 1F illustrates a side cross-sectional view of the mask following formation of a spacer over the mandrel, according to embodiments of the present disclosure.
FIG. 1G illustrates a side cross-sectional view of the mask following partial removal of the spacer, according to embodiments of the present disclosure.
FIG. 1H illustrates a side cross-sectional view of the mask following removal of the mandrel, according to embodiments of the present disclosure.
Figure 2:
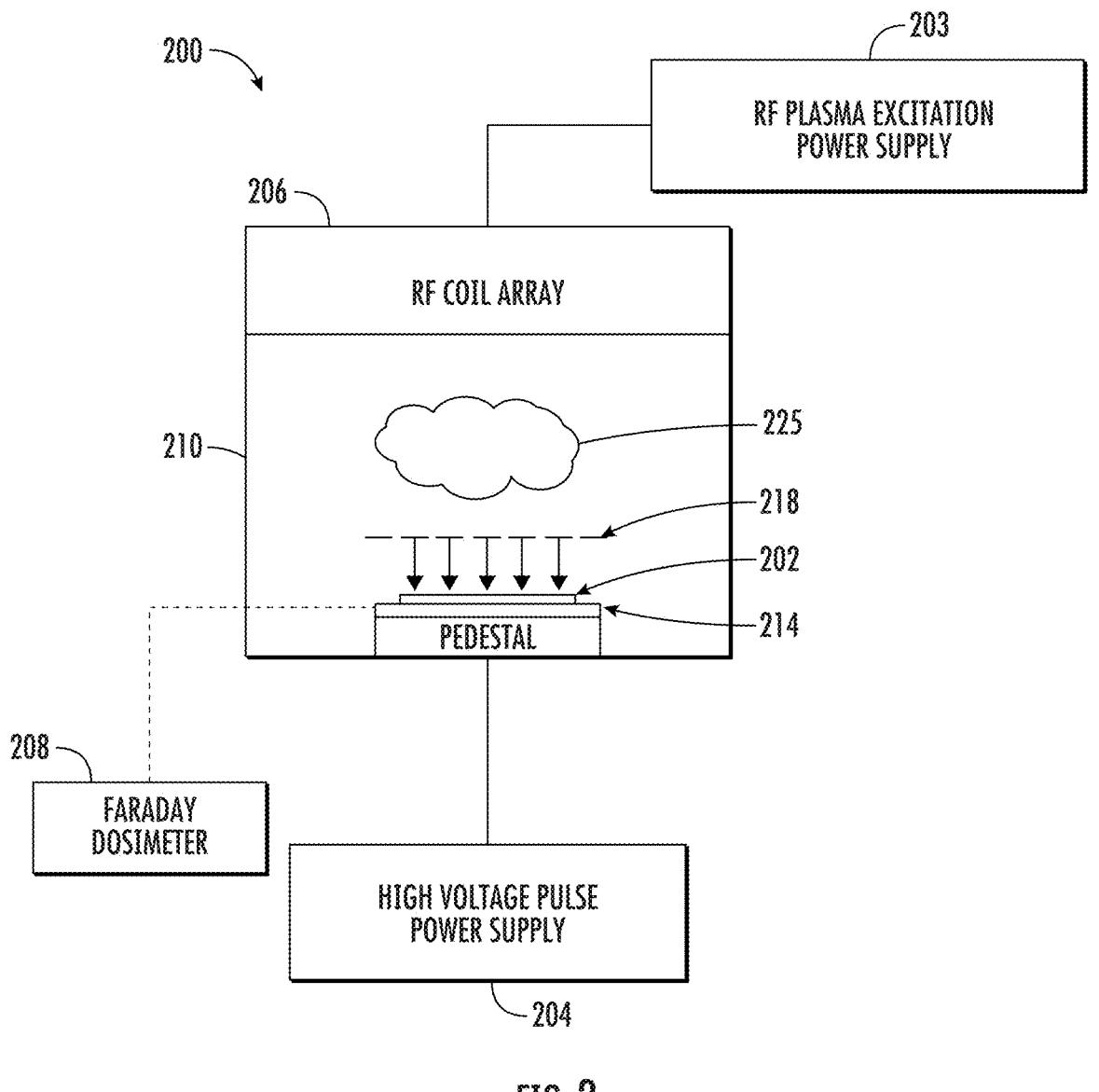
FIG. 2 is a plasma doping system, according to embodiments of the present disclosure.

Next, as shown in FIG. 1F, a spacer 126 may be formed over the mandrel film layers 102. Although non-limiting, the spacer 126 may be an oxide, which is deposited atop the mandrel 123 and atop the upper surface 124 of the second DARC layer 109. In some embodiments, the spacer 126 is formed using an oxygen plasma deposition process in which the oxide attaches to corners 127 of the mandrel 123.

Next, as shown in FIG. 1G, a portion of the spacer 126 may then be removed. More specifically spacer 126 may be etched from the upper surface 124 of the second DARC layer 109 and from an upper surface 130 of the mandrel 123. As shown, the spacer 126 remains along first and second sidewalls 132 of the mandrel 123. The mandrel 123 may then be removed, as shown in FIG. 1H. The mandrel 123 may be removed selective to the upper surface 124 of the second DARC layer 109.

As shown in FIG. 1I, the mask 100 may be processed (e.g., etched) to remove those portions of the second DARC layer 109 left uncovered by the spacer 126. In some embodiments, the second DARC layer 109 may be removed selective to an upper surface 136 of the AHM 108. Etching may continue through the AHM 108 to form a set of vertical features 140, as shown in FIG. 1J. Although non-limiting, the vertical features 140 may be DRAM buried wordlines. The vertical features 140 may extend perpendicular to a plane defined by an upper surface 142 of the first oxide layer 107. A metrology scan may then be performed to verify various attributes of the vertical features 140, such as line wiggle, LER, and space width roughness (SpWR). Although non-limiting, in one embodiment, following the SAQP demonstrated in FIGS. 1A-1J, it may be desirable to have a line wiggle less than 6.5 A, a LER less than 11 A, and SpWR less than 13.5 A.

Figure 3:
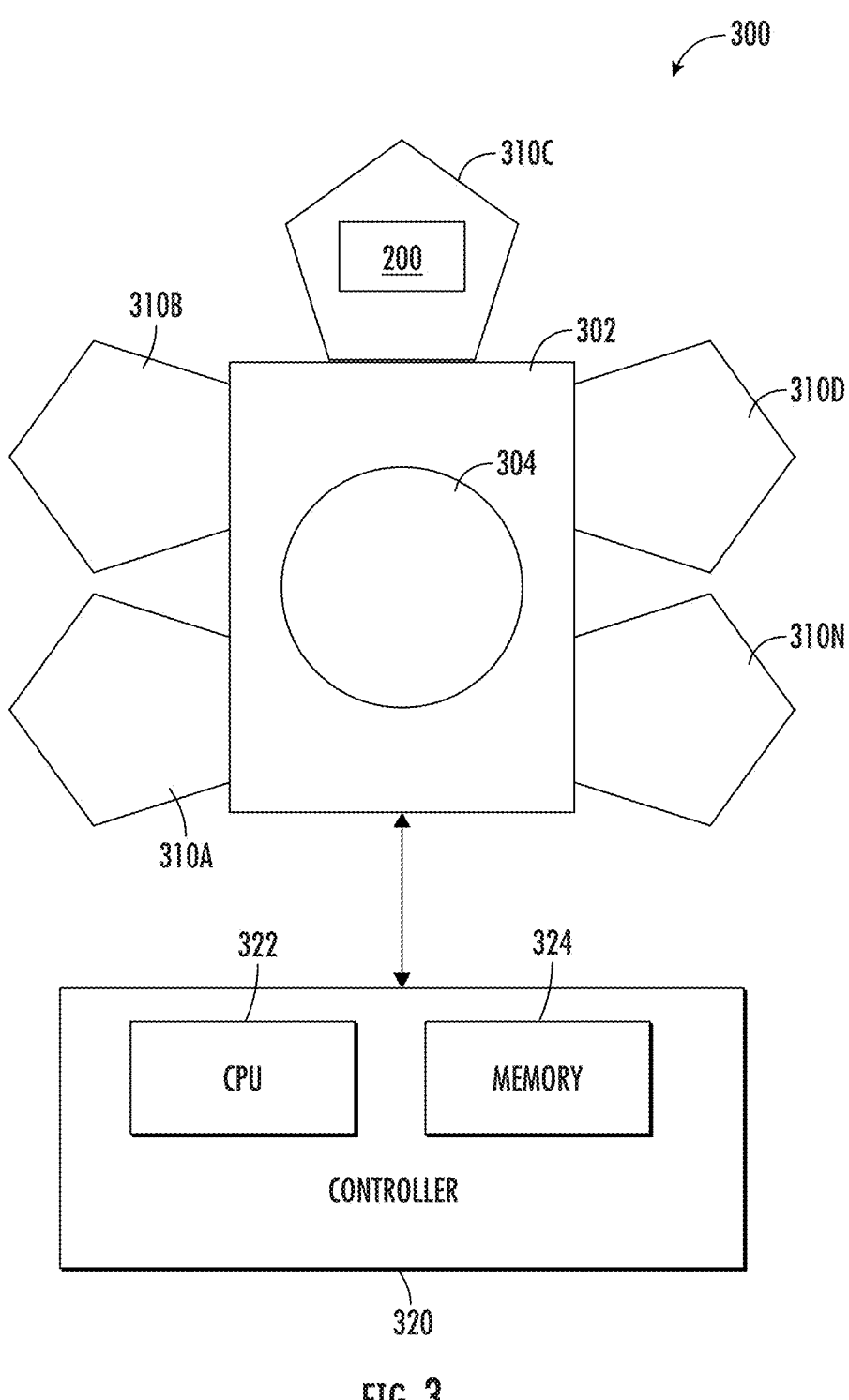
FIG. 3 illustrates a perspective view of an example processing system, according to embodiments of the present disclosure.

Referring to FIG. 3, an example system 200 (e.g., a PLAD system) operable to provide pulsed RF-excited plasma doping to the mask 100 of FIGS. 1A-1J, will be described. As shown, the system 200 may include a plasma power supply 203, a voltage pulse power supply 204, an RF coil array 206, and a dosimeter 208. Within a plasma chamber 210 is a wafer/substrate 202, upon which the mask 100 may be provided. A platen/pedestal 214 may support the wafer 202, and a sheath 218 may be formed above the wafer 202. In some embodiments, the platen/pedestal 214 may be heated, e.g., to a temperature between 300-550° C., to allow the plasma treatment processes described herein to be performed at an elevated temperature. The dosimeter 208 may be a Faraday dosimeter or other type of sensor that directly measures the dose of ions received by the wafer 202. Although non-limiting, the dosimeter can be located on the pedestal 214, proximate to the wafer 202.

During use, the plasma power supply 203 and the RF coil array 206 deliver radio frequency excitation to generate a plasma 225 when gaseous species are delivered into the plasma chamber 210. For example, the plasma power supply 203 may be an RF powered inductively coupled power source to generate inductively coupled plasma 225, as known in the art. Gaseous species may be delivered from one or more gas sources (not separately shown) to generate ions of any suitable species, such as He, H2, or CH4.

The voltage pulse power supply 204 may generate a bias voltage between the wafer 202 and the plasma chamber 210. As such, when the voltage pulse power supply 204 generates a voltage between the plasma chamber 210 and the substrate 202, a similar, but slightly larger, voltage difference is generated between the plasma 225 and the substrate 202. In one non-limiting example, a 5000 (5 kV) voltage difference established between the plasma chamber 210 and the substrate 202 (or, equivalently, pedestal 214) may generate a voltage difference of approximately 5005 V to 5030 V between the plasma 225 and the substrate 202. In some embodiments, the bias is a direct current (DC) bias supplied to the platen/pedestal 214.

When the plasma 225 is present in the plasma chamber 210, a controller (not shown) may generate a signal for the voltage pulse power supply 204 to apply a pulse routine to the substrate 202, where the pulse routine constitutes a plurality of extraction voltage pulses. As such, when the extraction voltage pulses are applied between the substrate 202 and plasma 225, ions are extracted in pulsed form from the plasma 225, generating a plurality of ion pulses that are directed to the substrate 202.

FIG. 4 shows a schematic of another example system/apparatus 300 according to embodiments of the disclosure. In some embodiments, the system 300 may be a cluster tool operable to perform processes necessary to form the mask 100 described herein and shown in FIGS. 1A-1J. Although non-limiting, the system 300 may include at least one central transfer station/chamber 302 and one or more robots 304 within the transfer station/chamber 302, wherein the robot 304 is operable to move a robot blade and a wafer to and from each of a plurality of processing chambers 310A-310N connected with, or positioned adjacent to, the transfer station/chamber 302. In some embodiments, the processing chambers 310A-310N may support ion implantation, material deposition, and material etching. The particular arrangement of process chambers and components can be varied depending on the cluster tool, and should not be taken as limiting the scope of the disclosure. In another example, one or more of the chambers may include multiple process regions within a same chamber, which permits a common supply of gases, common pressure control, and common process gas exhaust/pumping. Modular design of the system enables rapid conversion from one configuration to any other.

In some embodiments, processing chamber 310A may be a deposition chamber operable to deposit the various mandrel film layers 102. The first deposition chamber 310A may be further used to deposit the mask film layer 116 and the masking layer 118. Although non-limiting, the deposition chamber may include one or more of an atomic layer deposition chamber, a plasma enhanced atomic layer deposition chamber, a chemical vapor deposition chamber, a plasma enhanced chemical vapor deposition chamber, or a physical deposition.

In some embodiments, processing chamber 310B may be an etch chamber operable to remove portions of the mask film layer 116, the masking layer 118, and the second carbon layer 110 to form mandrel 123. Processing chamber 310B may be further used to remove additional portions of the mandrel film layers 102 to form the vertical features 140.

In some embodiments, processing chamber 310C may be operable to perform the implant process 112. In some embodiments, the implant process 112 may be performed by the system 200. In some embodiments, the implant process 112 may be performed while the pedestal is maintained at room temperature, e.g., between 15-25° C. In other embodiments, the implant process 112 may be performed while the platen is maintained at a high temperature, e.g., between 300-550° C. In some embodiments, the implant process 112 is low energy e.g., <10 KV.

In some embodiments, processing chamber 310D may be operable to perform one or more annealing processes to the mask. In some embodiments, suitable post-ion implant thermal treatment techniques include UV treatment, thermal annealing, and laser annealing. Using the high temperature implant described herein can lower the stress and further improve anneal sensitivity.

A system controller 320 is in communication with the robot 304, the transfer station/chamber 302, and the plurality of processing chambers 310A-310N. The system controller 320 can be any suitable component that can control the processing chambers 310A-310N and robot(s) 304, as well as the processes occurring within the process chambers 310A-310N. For example, the system controller 320 can be a computer including a central processor 322, memory 324, suitable circuits/logic/instructions, and storage.

Processes or instructions may generally be stored in the memory 324 of the system controller 320 as a software routine that, when executed by the processor 322, causes the processing chambers 310A-310N to perform processes of the present disclosure. The software routine may also be stored and/or executed by a second processor (not shown) that is remotely located from the hardware being controlled by the processor 322. Some or all of the method(s) of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor 322, transforms the general-purpose computer into a specific purpose computer (controller) that controls the chamber operation such that the processes are performed.

In various embodiments, design tools can be provided and configured to create the datasets used to pattern the film layers of the mask, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
providing a stack of mandrel film layers;
implanting an upper layer of the stack of mandrel film layers;
forming a mask film layer over the upper layer following the implant;
forming a patterning layer over the mask film layer;
partially removing the patterning layer and the mask film layer; and
patterning the stack of mandrel film layers to form a set of vertical features.

2. The method of claim 1, wherein implanting the upper layer of the stack of mandrel film layers comprises delivering ions into the upper layer while the stack of mandrel film layers is maintained at a temperature between 15-25° C.

3. The method of claim 1, wherein implanting the upper layer of the stack of mandrel film layers comprises delivering ions into the upper layer while the stack of mandrel film layers is maintained at a temperature between than 300-550° C.

4. The method of claim 3, further comprising positioning the stack of mandrel film layers atop a pedestal, wherein the pedestal is maintained at a temperature between than 300-550° C.

5. The method of claim 4, further comprising providing a direct current (DC) bias to the pedestal while the upper layer of the stack of mandrel film layers is implanted.

6. The method of claim 1, wherein implanting the upper layer of the stack of mandrel film layers comprises delivering ions into the upper layer at an implant energy less than 10 KV.

7. The method of claim 1, wherein the upper layer of the stack of mandrel film layers is a spin-on-carbon layer.

8. The method of claim 1, wherein the mask film layer is a high-stress dielectric layer.

9. A method for patterning a stack of mandrel film layers, the method comprising:
implanting an upper layer of the stack of mandrel film layers, wherein the implant is performed at an implant energy less than 10 KV;
forming a mask film layer over the upper layer following the implant to the upper layer of the stack of mandrel film layers;
forming a patterning layer over the mask film layer;
partially removing the patterning layer and the mask film layer; and
patterning the stack of mandrel film layers to form a set of vertical features.

10. The method of claim 9, wherein implanting the upper layer of the stack of mandrel film layers comprises delivering ions into the upper layer while the stack of mandrel film layers is maintained at a temperature between 15-25° C.

11. The method of claim 10, further comprising positioning the stack of mandrel film layers atop a pedestal, wherein the pedestal is maintained at a temperature between than 300-550° C.

12. The method of claim 11, further comprising providing a direct current (DC) bias to the pedestal during the implanting.

13. The method of claim 9, wherein the upper layer of the stack of mandrel film layers is a spin-on-carbon layer, wherein the mask film layer is a high-stress dielectric layer, and wherein the patterning layer is a photoresist layer.

14. The method of claim 9, wherein patterning the stack of mandrel film layers to form the set of vertical features comprises:
removing the patterning layer and the mask film layer to form a mandrel;
forming a spacer over the mandrel;
partially removing the spacer; and
removing the mandrel.

15. A method for patterning a dynamic random-access memory (DRAM) hard mask, the method comprising:
implanting an upper layer of a stack of mandrel film layers, wherein the implant is performed at an implant energy less than 10 KV;
forming a mask film layer over the upper layer following the implant to the upper layer of the stack of mandrel film layers;
forming a patterning layer over the mask film layer;
partially removing the patterning layer and the mask film layer; and patterning the stack of mandrel film layers to form a set of buried word lines.

16. The method of claim 15, wherein implanting the upper layer of the stack of mandrel film layers comprises delivering ions into the upper layer while the stack of mandrel film layers is maintained at a temperature between 15-25° C.

17. The method of claim 15, further comprising positioning the stack of mandrel film layers atop a pedestal, wherein the pedestal is maintained at a temperature between than 300-550° C.

18. The method of claim 17, further comprising providing a direct current (DC) bias to the pedestal during the implanting.

19. The method of claim 15, wherein the upper layer of the stack of mandrel film layers is a spin-on-carbon layer, wherein the mask film layer is a high-stress dielectric layer, and wherein the patterning layer is a photoresist layer.

20. The method of claim 15, wherein patterning the stack of mandrel film layers to form the set of buried word lines comprises:

removing the patterning layer and the mask film layer to form a mandrel;

forming a spacer over the mandrel;

partially removing the spacer;

removing the mandrel; and etching the stack of mandrel film layers.

\* \* \* \* \*